United States Patent
Choi

(10) Patent No.: US 6,859,078 B2
(45) Date of Patent: Feb. 22, 2005

(54) DELAY LOCK LOOP CIRCUIT

(75) Inventor: Jung-Hwan Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/641,313

(22) Filed: Aug. 14, 2003

(65) Prior Publication Data

US 2004/0051572 A1 Mar. 18, 2004

(30) Foreign Application Priority Data

Sep. 12, 2002 (KR) .................................. 10-2002-0055354

(51) Int. Cl.[7] .................................................. H03L 7/06
(52) U.S. Cl. ..................... 327/149; 327/158; 327/269
(58) Field of Search ................................. 327/149, 152, 327/153, 158, 161, 269, 270

(56) References Cited

U.S. PATENT DOCUMENTS 6,047,346 A * 4/2000 Lau et al. .................... 327/158
6,321,282 B1 * 11/2001 Horowitz et al. ........... 710/104
6,469,555 B1 * 10/2002 Lau et al. .................... 327/158
6,643,787 B1 * 11/2003 Zerbe et al. ................. 713/400

* cited by examiner

Primary Examiner—Timothy P. Callahan
Assistant Examiner—Cassandra Cox
(74) Attorney, Agent, or Firm—Mills & Onello LLP

(57) ABSTRACT

A delay lock loop circuit includes a reference loop for receiving an external clock signal and for generating a second output signal and a first output signal which includes a plurality of signals having different respective phases. A fine loop receives the external clock signal and the first output signal of the reference loop and generates an internal clock signal. A transition detecting circuit receives the second output signal of the reference loop and generates a protection signal by detecting a transition of the logic state of the second output signal of the reference loop. In response to the protection signal, the delay lock loop circuit in accordance with the present invention protects itself from an external clock signal that has a frequency that is out of the range of operable frequencies of the delay lock loop circuit, for example by disabling the entire circuit, or a portion of the circuit.

6 Claims, 3 Drawing Sheets

DELAY LOCK LOOP CIRCUIT

BACKGROUND OF THE INVENTION

1. Field of the Invention

The present invention relates to a delay lock loop circuit, and more particularly to a delay lock loop circuit capable of automatically protecting itself when an external clock signal having a frequency that is out of the range of operable frequencies of the delay lock loop circuit is input thereto.

2. Description of the Related Art

FIG. 1 illustrates a conventional delay lock loop circuit. Referring to FIG. 1, a conventional delay lock loop circuit is configured in a double loop structure that includes a reference loop 10 and a fine loop 20. The reference loop 10 receives an external clock signal CLK, and outputs n (where n is a positive integer) output signals RLOUT which have the same frequency as that of the external signal CLK and have different phases with respect to each other. The fine loop 20 generates an internal clock signal ICLK having phase that is similar to that of the external clock signal CLK in response to the output signals RLOUT of the reference loop 10.

Such a conventional delay lock loop circuit has an associated disadvantage in that it can perform an excessive number of extraneous operations when an external clock signal CLK having a frequency that is out of the operable frequency range of the delay lock loop circuit is applied thereto.

SUMMARY OF THE INVENTION

It is a feature of an embodiment of the present invention to provide a delay lock loop circuit capable of automatically protecting itself when an external clock signal having a frequency that is out of the normal operable range of frequencies of the delay lock loop circuit is input thereto.

In accordance with the present invention, there is provided a delay lock loop circuit comprising: a reference loop for receiving an external clock signal and for generating a first output signal being comprised of a plurality of signals having different respective phases and a second output signal; a fine loop for receiving the external clock signal and the first output signal of the reference loop and, in response, generating an internal clock signal; and a transition detecting circuit for receiving the second output signal of the reference loop and generating a protection signal in response to a detected transition in a logic state of the second output signal of the reference loop.

Preferably, the reference loop may comprise: a phase detecting circuit for receiving the external clock signal and a delay output signal and for generating the second output signal of the reference loop; a bias adjusting circuit for receiving the external clock signal and the second output signal of the reference loop and for generating a bias adjusting signal; and a delay circuit for receiving the external clock signal and the bias adjusting signal and for generating the delay output signal and the first output signal of the reference loop.

Preferably the delay circuit may be controlled by the bias adjusting circuit and comprises a plurality of delay elements serially connected to each other.

Preferably, the transition detecting circuit may comprise a T-flip-flop for receiving the second output signal of the reference loop and performing a flop-flop operation, an XOR circuit for receiving the second output signal of the reference loop and an output signal of the T-flip-flop and performing an exclusive-OR operation, an inverter for inverting an output signal of the XOR circuit, a counter for receiving the external clock signal and the output signal of the XOR circuit and for generating a carry signal when a predetermined number of external clock signal cycles are input thereto, and an AND gate for receiving the output signal of the inverter and the carry signal from the counter and for performing an AND operation.

The plurality of signals of the first output signal preferably have a frequency that is substantially the same as that of the external clock signal. The internal clock signal preferably has a phase that is substantially the same as that of the external clock signal.

BRIEF DESCRIPTION OF THE DRAWINGS

The above and other features and advantages of the present invention will become readily apparent to those of ordinary skill in the art by describing in detail preferred embodiments thereof with reference to the attached drawings in which.

DETAILED DESCRIPTION OF PREFERRED EMBODIMENTS

Figure 1:
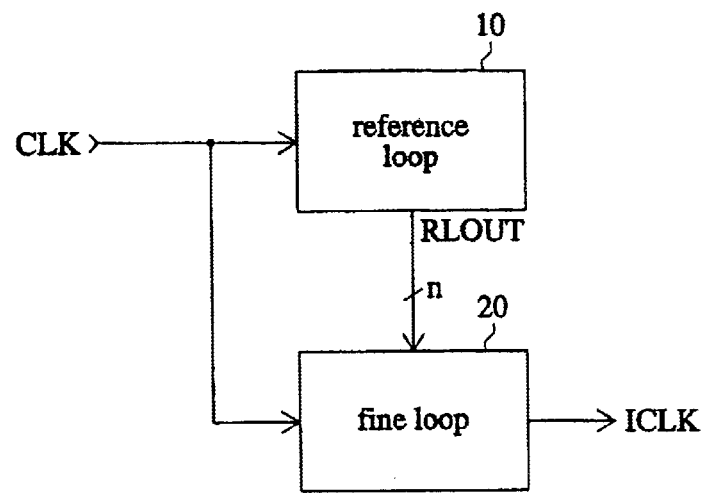
FIG. 1 is a block diagram of a conventional delay lock loop circuit.

Korean Patent Application No. 2002-55354, filed on Sep. 12, 2002 and entitled: "Delay-Locked Loop Circuit With Protection Function," to which the present application claim priority, is incorporated by reference herein in its entirety.

Hereinafter, the present invention will be described in detail by describing preferred embodiments of the present invention with reference to the accompanying drawings. Like reference numerals refer to like elements throughout the drawings.

Figure 2:
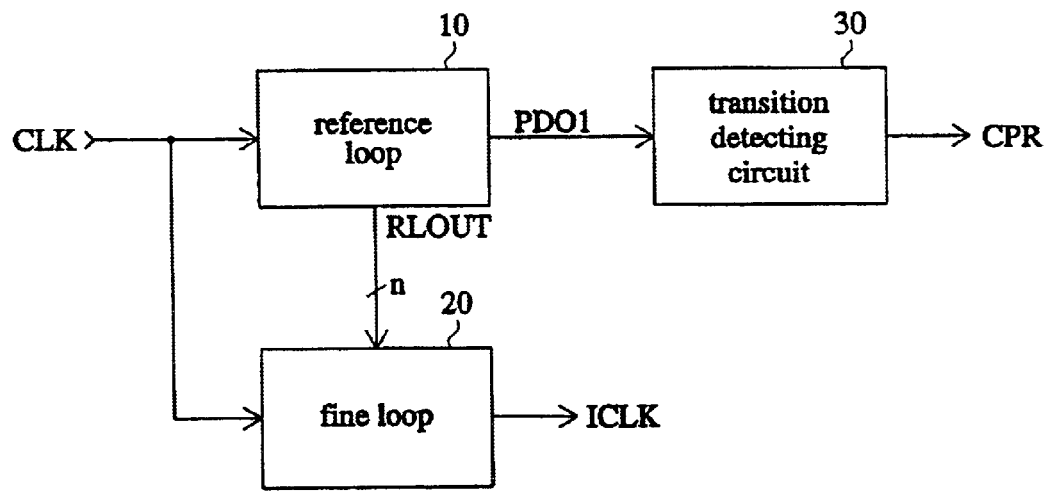
FIG. 2 is a block diagram of a delay lock loop circuit in accordance with the present invention.

FIG. 2 illustrates a block diagram of a delay lock loop circuit in accordance with the present invention.

Referring to FIG. 2, a delay lock loop circuit in accordance with the present invention comprises: a reference loop 10 for receiving an external clock signal CLK and for generating a first output signal RLOUT comprised of a plurality (n) of signals having different phases with respect to each other and a second output signal PDO1; a fine loop 20 for receiving the external clock signal CLK and the first output signals RLOUT of the reference loop 10 and for generating an internal clock signal ICLK; and a transition-detecting circuit 30 for receiving the second output signal PDO1 of the reference loop 10 and for generating a protection signal CPR.

The operation of the delay lock loop circuit shown in FIG. 2 will be described below.

The reference loop 10 receives the external clock signal CLK, detects the frequency of the external clock signal CLK, and generates the first output signal RLOUT comprised of a plurality (n) of signals and the second output signal PDO1, wherein each signal of the first output signal RLOUT has a frequency that is the same as that of the external clock signal CLK, but having different respective phases. The fine loop 20 receives the first output signal RLOUT of the reference loop 10 and generates an internal clock signal ICLK having a frequency and phase that is the same as that of the input external clock signal CLK. The transition detecting circuit 30 receives the second output signal PDO1 of the reference loop 10 and generates a protection signal CPR in response to the logic state ("1" or "0") of the second output signal PDO1 of the reference loop 10. The protection signal CPR is, for example, applied to a power-down circuit, thereby deactivating the entire delay lock loop circuit or, alternatively, disabling the output signal of the delay lock loop circuit.

Figure 3:
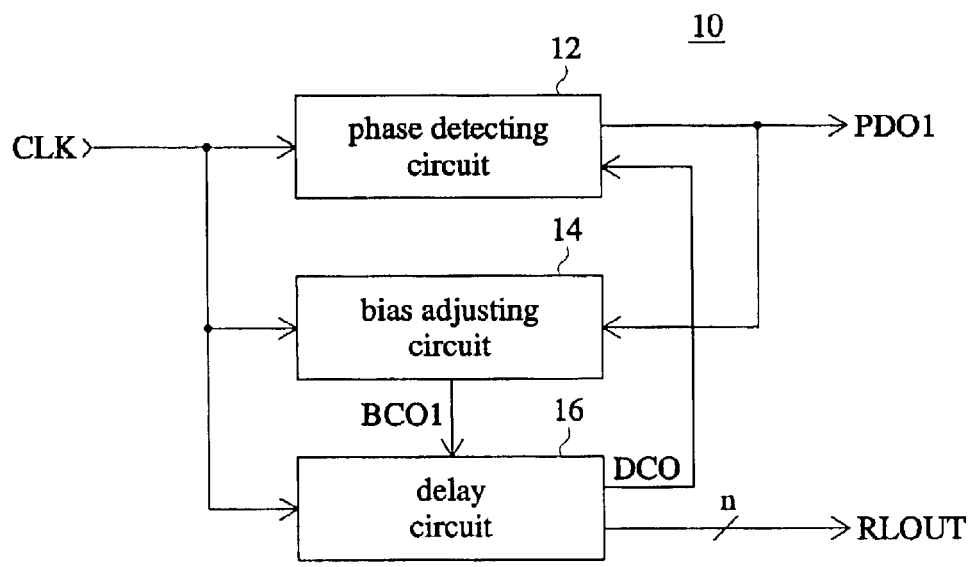
FIG. 3 is a detailed block diagram of the reference loop as shown in FIG. 2.

FIG. 3 is a detailed block diagram of the reference loop circuit 10 of FIG. 2.

Referring to FIG. 3, the reference loop circuit 10 comprises: a first phase detecting circuit 12 for receiving the external clock signal CLK and a delay output signal DCO and for generating the second output signal PDO1 of the reference loop 10; a bias adjusting circuit 14 for receiving the external clock signal CLK and the second output signal PDO1 of the reference loop 10 and for generating a bias adjusting signal BCO1; and a delay circuit 16 for receiving the external clock signal CLK and the bias adjusting signal BCO1 and generating a delayed output signal DCO and the first output signal RLOUT of the reference loop 10.

Figure 4:
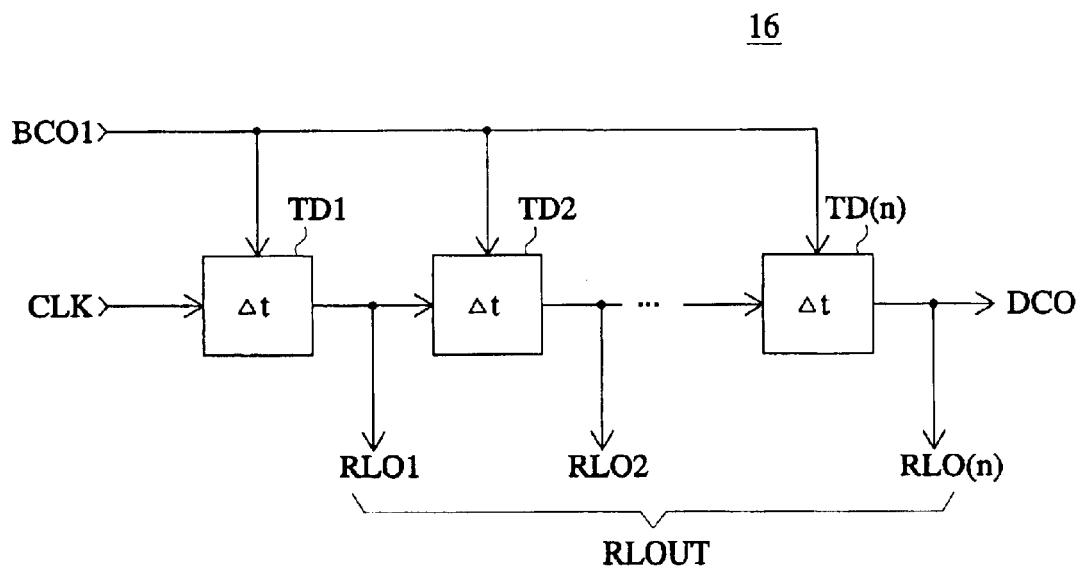
FIG. 4 is a detailed block diagram of the delay circuit as shown in FIG. 2.

FIG. 4 illustrates the delay circuit 16 in FIG. 3 in detail.

Referring to FIG. 4, the delay circuit 16 comprises: a first delay element TD1 for receiving the external clock signal CLK and the bias adjusting signal BCO1 and for generating a first delay signal RLO1; a second delay element TD2 for receiving the first delay signal RLO1 and the bias adjusting signal BCO1 and for generating a second delay signal RLO2; and an n-th delay element TDn for receiving an n-1-th delay signal RLOn-1 and the bias adjusting signal BCO1 and for generating an n-th delay signal RLOn. The first delay signal RLO1 to the n-th delay signal RLOn corresponds to the first output signal RLOUT of the reference loop 10. The delay output signal DCO corresponds to the n-th delay signal RLOn of the n-th delay element TDn.

The operation of the reference loop 10 will be described below with reference to FIG. 3 and FIG. 4.

The first phase detecting circuit 12 receives the external clock signal CLK and the delay output signal DOC of the delay circuit 16, compares them with each other, and generates the second output signal PDO1 of the reference loop 10, wherein the second output signal PDO1 has a logical value of "1" or "0". The bias adjusting circuit 14 receives the second output signal PDO1 of the reference loop 10 and generates the bias adjusting signal BCO1, thereby adjusting the amount of current flowing through each of delay elements TD1–TDn. In this manner, the amount of delay applied by each of the delay elements TD1–TDn may be changed. In this manner, the first phase detecting circuit 12 continuously compares the external clock signal CLK and the output signals of the delay circuit 16, and outputs the comparison results. As a result, a clock signals RLOUT having the precise frequency of that of the input clock signal CLK may be generated.

Figure 5:
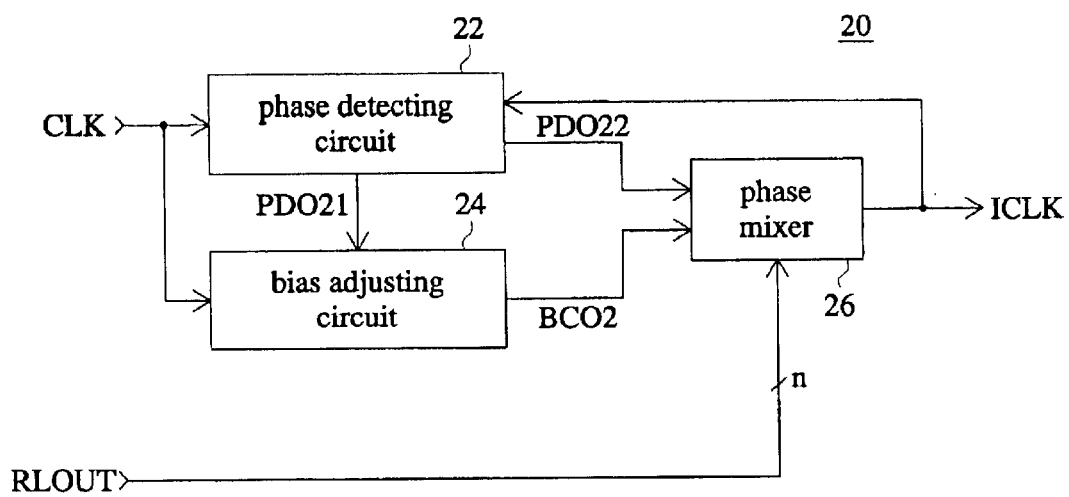
FIG. 5 is a detailed block diagram of the fine loop shown in FIG. 2.

FIG. 5 illustrates the fine loop 20 of FIG. 2 in detail.

Referring to FIG. 5, the fine loop 20 comprises: a second phase detecting circuit 22 for receiving the external clock signal CLK and the internal clock signal ICLK and for generating a first output signal PDO21 and a second output signal PDO22; a bias adjusting circuit 24 for receiving the external clock signal CLK and the first output signal PDO21 of the second phase detecting circuit 22 and for generating a bias adjusting signal BCO2; and a phase mixer 26 for receiving the second output signal PDO22 of the second phase detecting circuit 22, the bias adjusting signal BCO2 and the first output signal RLOUT of the reference loop 10, and for generating the internal clock signal ICLK by mixing the n signals of the first output signal RLOUT of the reference loop 10.

The fine loop 20 thus generates an internal clock signal ICLK having the same phase as the external clock signal CLK input to the second phase detecting circuit 22.

Figure 6:
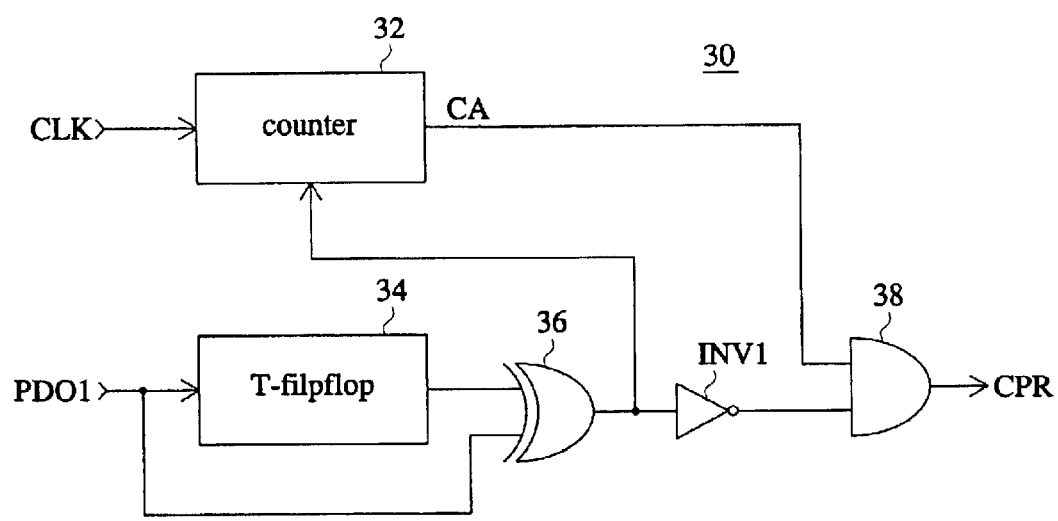
FIG. 6 is a detailed schematic diagram of the transition-detecting circuit shown in FIG. 2.

FIG. 6 illustrates the transition detecting circuit 30 shown in FIG. 2 in detail.

Referring to FIG. 6, the transition detecting circuit comprises: a T-flip-flop 34 for receiving the output signal PDO1 of the first phase detecting circuit 12 and for performing a flip-flop operation; an XOR circuit 36 for receiving the output signal PDO1 of the first phase detecting circuit 12 and an output signal of the T-flip-flop 34 and for performing an exclusive-OR operation on the received signals; an inverter INV1 for inverting the output signal of the XOR circuit 36; a counter 32 for receiving the external clock signal CLK and the output signal of the XOR circuit 36 and for generating a carry signal CA; and an AND gate 38 for performing an AND operation on an output signal of the inverter INV1 and the carry CA.

The operation of the transition detecting circuit 30 will be described below.

The counter 32 receives the external clock signal CLK and generates the carry signal CA, and is reset by the output signal of the XOR circuit 36. The T-flip-flop 34 generates an output signal having a different logic state from that of a previous output signal when a signal having a logic "1" state is input thereto but maintains logic state of a previous output signal thereof when a signal having a logic "0" level is input thereto.

If a previous output signal of the T-flip-flop 34 has a logic "0" state and a signal PDO1 having a logic "1" state is input to the T-flip-flop 34, the counter 32 is reset by the resulting logic "1" state of the output signal of the XOR circuit 36, and the transition detecting circuit 30 outputs the output signal CPR at a logic "0" state.

On the other hand, when a previous output signal of the T-flip-flop 34 has a logic "0" state and a signal PDO1 having a logic "0" state is input to the T-flip-flop 34, the output, carry CA, of the counter 32 becomes logic "1" after a pre-determined number of clock cycles in response to the output signal of the XOR circuit 36 having a logic "0" state. Accordingly, the output signal CPR of the transition detecting circuit 30 has a logic "1" level.

If a previous output signal of the T-flip-flop 34 has a logic "1" level and a signal PDO1 having a logic "1" state is input to the T-flip-flop 34, the XOR circuit 36 outputs an output signal at a logic "0" level, so that the carry CA of the counter 32 becomes logic "1" after a predetermined number of clock cycles. Accordingly, the transition detecting circuit 30 outputs an output signal CPR at a logic "1" level.

That is, if the output signal CPR of the transition detecting circuit 30 has a logic "0" level, the output signal PDO1 of the first phase detecting circuit 12 changes, but if the output signal CPR of the transition detecting circuit 30 has a logic "1" level, the output signal PDO1 of the first phase detecting circuit 12 does not change.

No change in the output signal PDO1 of the first phase detecting circuit 12 for a predetermined number of clock cycles means that the input external clock signal has a frequency that is not in the operable frequency range of the delay lock loop circuit. In this case, for example, the delay lock loop circuit applies the protection signal CPR to a power down circuit, thereby disabling the entire circuit, or applies the protection signal CPR to the output terminal of the delay lock loop circuit, thereby disabling the output signal of the delay loop circuit.

As described above, the delay lock loop circuit in accordance with the present invention is capable of automatically protecting itself when an external clock signal having a frequency that is out of the operable range of frequencies is input thereto.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A delay lock loop circuit, comprising:

a reference loop for receiving an external clock signal, for generating a first output signal which includes of a plurality of signals having different respective phases, and for generating a second output signal;

a fine loop for receiving the external clock signal and the first output signal of the reference loop, and, in response, generating an internal clock signal; and a transition detecting circuit for receiving the second output signal of the reference loop and generating a protection signal in response to a transition in a logic state of the second output signal of the reference loop.

2. The delay lock loop circuit according to claim 1, wherein the reference loop comprises:

a phase detecting circuit for receiving the external clock signal and a delay output signal and for generating the second output signal of the reference loop;

a bias adjusting circuit for receiving the external clock signal and the second output signal of the reference loop and for generating a bias adjusting signal; and a delay circuit for receiving the external clock signal and the bias adjusting signal and for generating the delay output signal and the first output signal of the reference loop.

3. The delay lock loop circuit according to claim 2, wherein the delay circuit is controlled by the bias adjusting circuit and comprises a plurality of delay elements serially connected to each other.

4. The delay lock loop circuit according to claim 1, wherein the transition detecting circuit comprises:

a T-flip-flop for receiving the second output signal of the reference loop and performing a flop-flop operation;

an XOR circuit for receiving the second output signal of the reference loop and an output signal of the T-flip-flop and performing an exclusive-OR operation;

an inverter for inverting an output signal of the XOR circuit;

a counter for receiving the external clock signal and the output signal of the XOR circuit and for generating a carry signal when a predetermined number of external clock signal cycles are input thereto; and an AND gate for receiving the output signal of the inverter and the carry signal from the counter and for performing an AND operation.

5. The delay lock loop circuit of claim 1 wherein the plurality of signals of the first output signal have a frequency that is substantially the same as that of the external clock signal.

6. The delay lock loop circuit of claim 1 wherein the internal clock signal has a phase that is substantially the same as that of the external clock signal.

* * * * *